United States Patent
Fujimori et al.

(10) Patent No.: US 6,522,277 B2
(45) Date of Patent: Feb. 18, 2003

(54) CIRCUIT, SYSTEM AND METHOD FOR PERFORMING DYNAMIC ELEMENT MATCHING USING BI-DIRECTIONAL ROTATION WITHIN A DATA CONVERTER

(75) Inventors: Ichiro Fujimori, San Diego, CA (US); Armond Hairapetian, Glendale, CA (US); Lorenzo Longo, Dove Canyon, CA (US)

(73) Assignees: Asahi Kasei Microsystems, Inc. (JP); Broadcom Corporation, Irvine, CA (US)

( * ) Notice: Subject to any disclaimer, the term of this patent is extended or adjusted under 35 U.S.C. 154(b) by 27 days.

(21) Appl. No.: 09/778,049

(22) Filed: Feb. 5, 2001

(65) Prior Publication Data

US 2002/0105453 A1 Aug. 8, 2002

(51) Int. Cl.$^7$ ................................. H03M 1/16
(52) U.S. Cl. ................... 341/144; 341/118; 341/143; 341/150
(58) Field of Search ................... 341/144, 145, 341/118, 120, 143, 150, 153, 154, 122, 117

(56) References Cited

U.S. PATENT DOCUMENTS

| | | | |
|---|---|---|---|
| 4,851,841 A | | 7/1989 | Sooch |
| 4,920,544 A | | 4/1990 | Endo et al. |
| 5,061,928 A | | 10/1991 | Karema et al. |
| 5,138,317 A | | 8/1992 | Story |
| 5,146,166 A | | 9/1992 | Bartuska |
| 5,221,926 A | * | 6/1993 | Jackson ............. 341/118 |
| 5,404,142 A | * | 4/1995 | Adams et al. ............. 341/144 |
| 5,406,283 A | | 4/1995 | Leung |
| 5,654,711 A | | 8/1997 | Fujimori |
| 5,675,340 A | * | 10/1997 | Hester et al. ............. 341/156 |
| 5,977,894 A | * | 11/1999 | McCarroll ............. 341/120 |
| 5,977,899 A | * | 11/1999 | Adams ............. 341/145 |
| 5,990,819 A | * | 11/1999 | Fujimori ............. 341/150 |
| 6,011,433 A | * | 1/2000 | Nairn ............. 330/2 |
| 6,124,813 A | * | 9/2000 | Robertson et al. ............. 341/143 |
| 6,147,551 A | * | 11/2000 | Hong ............. 327/554 |
| 6,154,162 A | * | 11/2000 | Watson et al. ............. 341/150 |
| 6,246,351 B1 | * | 6/2001 | Yilmaz ............. 341/145 |
| 6,329,941 B1 | * | 12/2001 | Farooqi ............. 341/145 |

OTHER PUBLICATIONS

Carley et al., *Delta–Sigma Data Converters: Theory, Design, and Simulation*, Nov. 1996. pp. 244–281.

Schreier, "Mismatch–Shaping Digital–to–Analog Conversion," Sep. 1977, pp. 1–12.

Baird et al., "Linearity Enhancement of Multibit ΔΣ A/D and D/A Converters Using Data Weighted Averaging," Dec. 1995, pp. 753–762.

Radke et al., "A Spurious–Free Delta–Sigma DAC Using Rotated Data Weighted Averaging," 1999, pp. 125–128.

* cited by examiner

Primary Examiner—Brian Young
Assistant Examiner—John Nguyen
(74) Attorney, Agent, or Firm—Kevin L. Daffer; Conley, Rose & Tayon P.C.

(57) ABSTRACT

A circuit, system, and method are provided for imparting improved randomness into the selection of components or elements of a data converter, such as a D/A converter. The elements are intended to be of equal value, however, regardless of whether they are or not. A circuit is used to randomly select subsets of elements according to a bi-directional selection technique in order to effectively rending the elements or components of equal value. Associated with each component is a switch, and a subset of the plurality of components are correspondingly switched in successive order progressing in a first direction and, subsequently, in successive order progressing in a second direction opposite the first direction. Connecting components in a first direction from left-to-right follows by selecting components in a second direction from right-to-left, and then again selecting components in the first direction from left-to-right, and so forth. A pointer will note the starting element of odd values and another pointer will note the starting element of even values. The pointers are updated each time a corresponding odd code value and even code value is sent to the data converter.

20 Claims, 8 Drawing Sheets

CIRCUIT, SYSTEM AND METHOD FOR PERFORMING DYNAMIC ELEMENT MATCHING USING BI-DIRECTIONAL ROTATION WITHIN A DATA CONVERTER

BACKGROUND OF THE INVENTION

1. Field of the Invention

This invention relates to a multi-bit data converter, wherein the data converter may be a digital-to-analog ("D/A") converter or a D/A converter used within a feedback path of an analog-to-digital ("A/D") converter. The data converter utilizes differing rotational algorithms, each being independent of the other. Preferably one algorithm involves rotation in one direction and the other algorithm involves rotation in another direction, with pointers keeping track of the last component connected. Thus, the data converter preferably involves a bi-directional rotation mechanism to select from among a plurality of components for connection within the D/A converter in order to minimize non-linearity, tonal distortion and complexity normally attributed to conventional rotational or purely random dynamic element matching ("DEM") logic.

2. Description of the Related Art

A popular data converter is a D/A converter either placed directly in the digital bitstream path or in the feedback loop path of an A/D converter. A typical A/D converter is one that quantifies the incoming analog signal magnitude at various time slices or sampling periods. The sampling rate can be Nyquist rate or a rate much higher than the Nyquist rate, often known as an "oversampling" rate.

A/D converters that use an oversampling modulator are often known as delta-sigma modulators. While a delta-sigma modulator is inherently an oversampling modulator, oversampling is just one of the techniques contributing to its overall performance. The oversampling modulator, or delta-sigma modulator, preferentially shapes the frequencies of the quantizer-induced noise so that the majority of noise lies between the Nyquist rate and the oversampling rate, and only a small portion is left in the frequency band of interest.

A delta-sigma modulator can be fairly simplistic in its architecture or rather complex depending on its targeted application. For example, the delta-sigma modulator can employ feedback to a single summing node at the input of a single integrator, or feedback to multiple summing nodes at the inputs of multiple integrators performing first order modulator, a second order modulator, etc. Examples of first and second order delta-sigma modulators are shown in U.S. Pat. No. 4,851,841 (herein incorporated by reference). In addition to multiple orders, delta-sigma modulators can be cascaded together with gain and/or scaling between stages, and possibly a noise cancellation circuit applied to each stage or combination of stages. Examples of cascaded delta-sigma modulators are described in U.S. Pat. Nos. 5,654,711; 5,146,166; 4,920,544; and 5,061,928 (each of which are herein incorporated by reference).

Regardless of whether they are single or multi-order, single or multi-stage, most modulators typically produce a single serial bit data stream of digital pulses representing a change in magnitude of the incoming analog signal. Delta-sigma modulators that produce a one-bit digital signal as a continuous stream of delta-sigma modulated pulses are known as one-bit quantizers. Oversampling modulators that receive analog signals are henceforth referred to as "analog delta-sigma modulators", while oversampling modulators that receive digital signals are henceforth known as "digital delta-sigma modulators."

A one-bit analog delta-sigma modulator is known to have optimal linearity since the D/A converter in the feedback loop has only two levels, which makes a one-bit analog delta-modulator inherently linear regardless of its quantization threshold position. Using only two levels of quantization, the threshold between those levels need not be accurately positioned because it is preceded by the high DC gain of the integrator. More recent quantizers, however, are multi-level quantizers. Multi-level quantizers require, however, several thresholds and corresponding spacings between thresholds. For example, a multi-bit quantizer can use a high-speed flash converter that assigns one comparator for each possible level. The comparator outputs are encoded into an appropriate binary word representative of a multi-bit digital signal. Thus, instead of having a one-bit output, a multi-bit quantizer produces numerous bits forwarded in parallel across corresponding conductors of a multi-conductor bus.

A multi-bit quantizer associated with either an analog or digital delta-sigma modulator has many advantages over the corresponding 1-bit analog or digital delta-sigma modulator. For example, a multi-bit delta-sigma modulator (analog or digital) has an inherently lower quantization noise since the imputed noise by the multi-bit quantizer decreases exponentially with the number of bits used in the quantizer. Thus, every additional bit used in the multi-bit quantizer significantly reduces the quantization noise and lessens the complexity of both the modulator (i.e., orders and stages) and the digital decimation filter. The lower noise-shaping order is achievable with smaller oversampling ratios. The low pass filter requirements within the D/A converter is also minimized due to the lower imputed noise. Additionally, multi-bit modulation enjoys reduced idle channel tones and a more relaxed analog speed requirement. By minimizing noise, a lower oversampling ratio is achieved for a given noise-shaping order, or vice-versa.

While multi-bit modulators have significant advantages over 1-bit modulators, multi-bit modulators can, unfortunately, introduce non-linearity into the converter. Non-linearity is primarily caused by misplaced levels in the multi-bit D/A converter. The misplaced levels force the encoded digital output to skew or improperly map. While multi-bit quantizers have many advantages such as lower quantization noise, more stability, and lower complexity needed of the digital decimation filter and low pass filter, multi-bit quantizers inherently induce non-linear gain and, more importantly, non-linearity into the incoming signal itself.

There currently exists several strategies for achieving a more linear multi-bit D/A converter. For example, the D/A converter can be made of components external to the mixed signal integrated circuit embodying the delta-sigma modulator. Alternatively, critical elements of the D/A converter can be trimmed to ensure accuracy and compatibility. Both strategies attempt to make the $2^N-1$ parallel unit elements (hereinafter "components") on the internal D/A topography approximately equal in value, where N is the number of bits received by a D/A converter. Forming the components external to the mixed signal integrated circuit, or trimming components on the same monolithic substrate on a dissimilar monolithic substrate, are techniques which can be categorized as "static element matching."

Another method of element matching is often referred to as "dynamic element matching," or DEM. DEM techniques are chosen to dynamically select differing subsets of each parallel unit element or component. Popular such components are resistors, transistors, current sources, and/or capacitors, which are targeted to be equal in value. The intent of DEM is to exploit the fact that the output of the multi-bit converter is followed by a filter that will remove high-frequency energy by converting the static error into a wide-band noise signal. DEM involves selecting different elements at different times, thereby imparting randomness into the selection process. An overview of the various fixed and dynamic element matching techniques is set forth in Carley et al., "Delta-Sigma ADCs With Multibit Internal Converters," *Delta-Sigma Data Converters: Theory, Design, and Simulation* (herein incorporated by reference).

There are various known DEM techniques used to choose different elements within the D/A converter. For example, interconnection between what is known as a thermometer decoder and the unit elements can be determined at random for each time period. With ideal randomization, there will be no correlation between the mismatch error at one time and the mismatch error at another time. Thus, a pure random DEM will connect the N outputs from the thermometer decoder to the M switching elements in a time-varying fashion. The number of possible connections, however, is M factorial. When M is relatively small, it is easy to randomly select between all possible connections. However, when M is large, the number of possible connections is so large it becomes necessary to select only a subset of connections in order to conserve die area. Unfortunately, this approach only converts the mismatch induced distortion components to white noise. The inband signal-to-noise ratio (SNR) will still be degraded by component mismatch.

In an attempt to reduce the amount of mismatch induced error in the band of interest and improve SNR, many researchers and manufacturers have turned to a technique known as data weighted averaging, dynamic element rotation, or rotated data weighted averaging. Radke et al., "A Spurious-Free Delta-Sigma DAC Using Rotated Data Weighted Averaging," *Custom Integrated Circuits Conference;* and, Baird et al., "Linearity Enhancement of Multibit ΔΣ A/D and D/A Converters Using Data Weighted Averaging," *IEEE Transactions on Circuits and Systems* (each of which are herein incorporated by reference).

The intent behind using data weighted averaging or rotation is to consistently change the element connections between the thermometer decoder and the unit elements. Depending on the weighting of the input data, the components are selected cyclically. This action will average the mismatch over series of samples, and will suppress mismatch induced noise or distortion by first order noise shaping. The rotational change, however, is single directive, periodic and can be carried out using a conventional shifter, such as a barrel shifter. Conventional rotation thereby consistently rotates or shifts in a round-robin fashion the various element connections. For example, a first group of components or elements (i.e., capacitors, resistors and/or current sources) are connected in an assigned, single direction (or order) that can wrap back around to the first element and continues forward. In each case, however, the assigned component order is typically from left-to-right whereby the left most component is connected first, followed by the remaining connections until the last component (the right most component in the D/A conversion chain) is connected. This proceeds for subsequent switching, whereby the next grouping of components or elements begins with the component immediately right of the previous last component (the right most component). The dynamic weighted averaging, rotational or barrel-shifted, mechanism is always single-directed. An unfortunate aspect of this type of rotational scheme is the unfortunate introduction of tones at the D/A output. The velocity of the rotation is determined by the weighting of the incoming data. Therefore, because of the periodic nature of rotation, the mismatch error becomes translated to dependent tones instead of completely random noise. These tones can become audible in audio applications, and can reduce the spurious free dynamic range ("SFDR") in communication applications.

SUMMARY OF THE INVENTION

The problems outlined above are in large part solved by using two independent rotational mechanisms for connecting components within a D/A converter. The first rotational mechanism may connect a subset of components that is the same, different from or partially different from the components being connected by the second rotational mechanism. Thus, the two independent rotational mechanisms allow for bi-directional rotation hereof. Bi-directional rotation can be achieved by a circuit implemented within a data converter, a suitable data converter being a multi-bit D/A converter. By using a bi-directional rotation scheme, tones are substantially eliminated within the output signal of a multi-bit modulator and/or quantizer.

Using a bi-directional rotation scheme within a multi-bit analog or digital converter (preferably a delta-sigma modulator) allows advantages of multi-bit modulation without the disadvantages of mismatch, non-linearity, and tonal defects normally attributed to multi-bit modulation and conventional DEM techniques.

According to one embodiment a circuit is provided for minimizing component value mismatches within a data converter (i.e., a D/A converter). The circuit includes a plurality of components and a plurality of corresponding switches. The switches are configured to connect a subset of the components in successive order progressing in a first direction and, subsequently, in successive order progressing in a second direction opposite the first direction. Connecting the subset in the first direction occurs when a thermometer code value is applied to switches within the data converter. Thus, the first code value will successively connect elements in a direction from left-to-right, and the next code value will successively connect switches in a direction from right-to-left. The next successive set of connections will re-connect in a left-to-right order, beginning with the last connection of the preceding left-to-right connection sequence. The bi-directional connection sequences will continue for each set of code values received by the data converter (e.g., D/A converter).

According to another embodiment, a system is provided. The system includes a multi-bit quantizer coupled to receive an input signal. DEM logic receives output from the quantizer and presents controlling signals to a D/A converter. Those signals are used to selectively couple components within the D/A converter. In particular, the control signal sequentially couples components in a first direction interspersed with coupling components within a second direction opposite the first direction. The input signal can be either digital or analog. Moreover, the output of the DEM activates a subset of switches within a D/A converter for connecting corresponding components to an operational amplifier.

According to yet another embodiment, a method is provided. The method is used to selectively connect components within a data converter, such as a D/A converter. The method includes first coupling a first set of components together, followed by coupling a second set of components together. The first set of components can be partially different or altogether different from the second set of components. Thereafter, third coupling occurs for connecting a third set of components together beginning with the last component within the first set and progressing among the plurality of components in a first direction. Thereafter, a fourth coupling occurs for connecting a fourth set of components together beginning with the last component within the second set and progressing among the plurality of components in a second direction opposite the first direction. The last component within the first set is preferably the last (or right-most) component connected during the first coupling, and wherein the last component within the second set is preferably the last (or left-most) component connected during the second coupling.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 1:
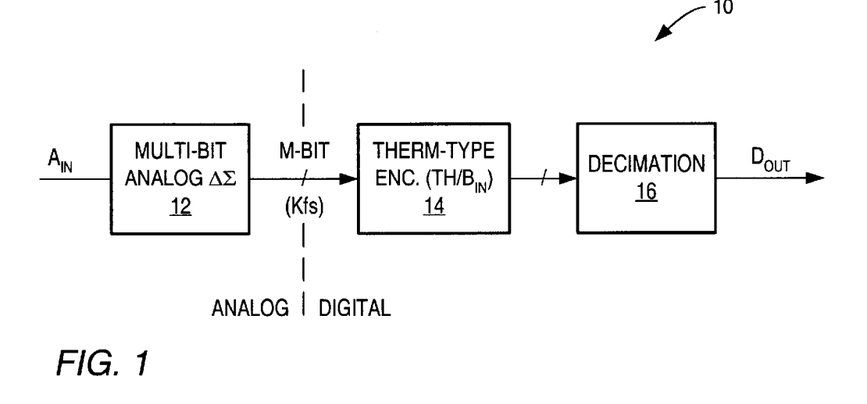
FIG. 1 is a block diagram of an A/D converter.

Turning to the drawings, FIG. 1 illustrates an A/D converter 10. Converter 10 preferably includes a multi-bit analog delta-sigma modulator 12 coupled to receive an analog input signal $A_{IN}$. Output from modulator 12 is a series of bits sampled at a oversampling rate of $Kf_s$. Coupled to receive the oversampled M-bits is a thermometer-type encoder 14. Encoder 14 produces a binary bit value that can be presented to a decimator 16. In addition to decimation, a filter may also be used.

Figure 2:
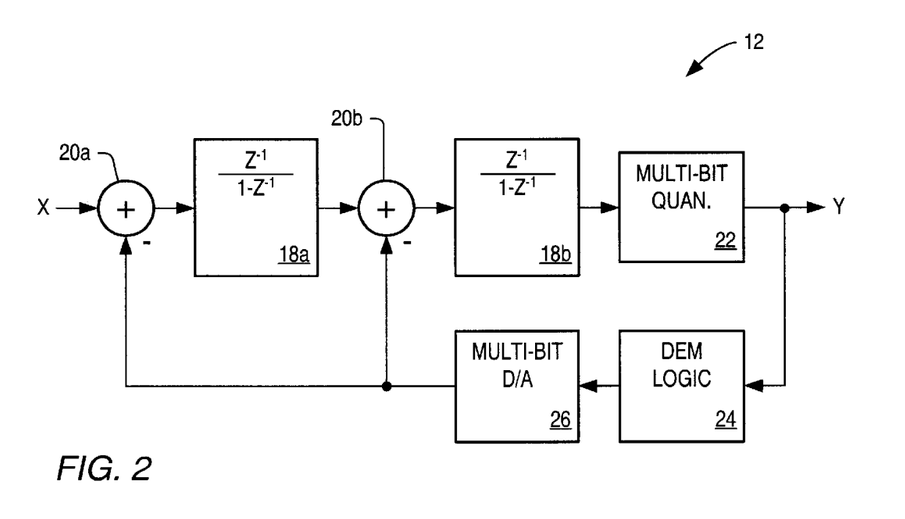
FIG. 2 is a block diagram of an exemplary multi-bit analog delta-sigma modulator used within the A/D converter of FIG. 1.

FIG. 2 illustrates one example by which the multi-bit analog delta-sigma modulator 12 can be implemented. For example, blocks 18a and 18b illustrate integrators with delay functionality. The integrators may also have a low pass filter capability, and are connected to receive sum node 20a and 20b outputs. In the example shown, modulator 12 is a second order delta-sigma modulator. Output from the second integrator 18b is an analog bitstream which is quantized by the multi-bit quantizer 22. Quantizer 22 has all the advantages of a multi-bit quantizer and, therefore, overcomes the disadvantages of a single-bit quantizer. Output from quantizer 22 is forwarded to DEM logic 24. DEM 24 provides control signals to switching circuitry within the multi-bit D/A 26. DEM logic 24 thereby serves to randomize the mismatch errors and non-linearity of elements within D/A converter 26. FIG. 2 illustrates only one example of possibly numerous types of multi-bit analog delta-sigma modulators which can be used to convert an analog signal to multiple bit digital output.

Figure 3:
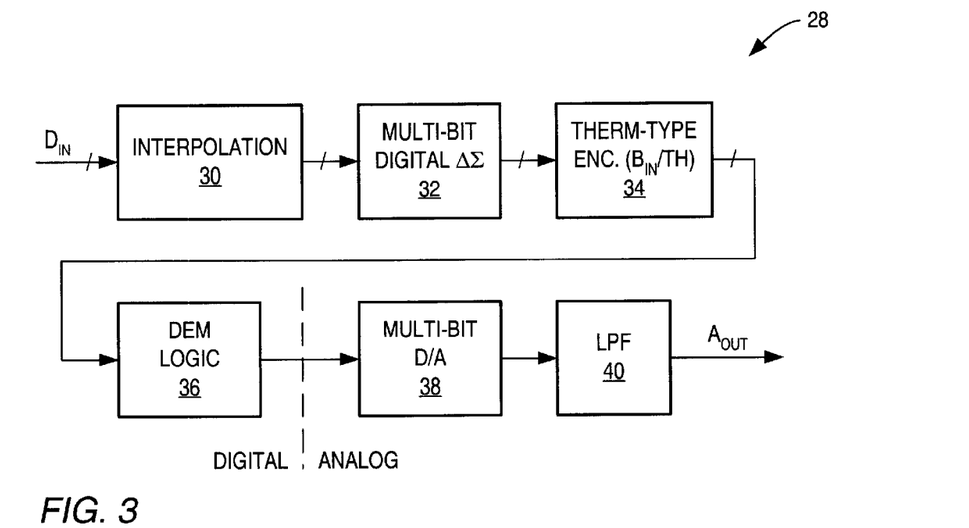
FIG. 3 is a block diagram of a D/A converter.

FIG. 3 illustrates a D/A converter 28. Converter 28 receives digital input $D_{IN}$ into an interpolation block 30, the output of which is forwarded to a multi-bit digital delta-sigma modulator 32. A digital delta-sigma modulator is similar to an analog delta-sigma modulator, except that at the front-end, accumulators, registers, and adders can be used. Digital delta-sigma modulator 32 therefor operates entirely in the digital domain, where negation at the summing node can be represented as two's complement adders. Thus, each of the analog elements can be replaced with corresponding digital elements, avoiding any D/A conversion in the feedback loop, and simply using the word selection units to select between words based on whether the input, feedback bitstream is 1 or 0. Coupled to the output of the digital delta-sigma modulator 32 is a thermometer-type encoder 34. Encoder 34 converts from binary to thermometer code, and presents the thermometer code to DEM logic 36. Logic 36 is combinatorial or sequential logic used to present the corresponding control signals to multi-bit D/A converter 38. Converter 38, and DEM logic 36 is similar to converter 26 and DEM logic 24, shown in FIG. 2.

Coupled to the output of D/A converter 38 is a low pass filter 40. Blocks 38 and 40 are shown in the analog realm, whereas blocks 30–36 are shown in the digital realm. Output from low pass filter 40 is an analog signal $A_{OUT}$.

Figure 4:
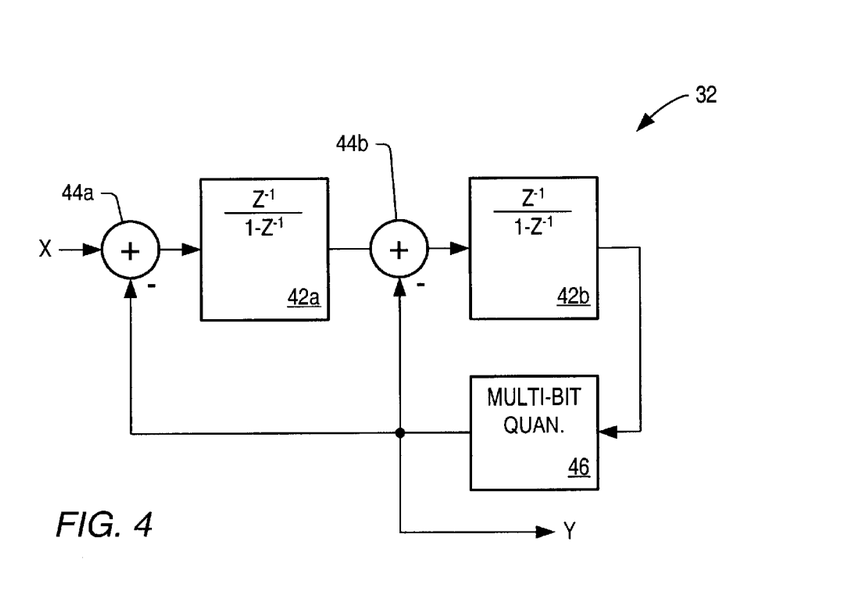
FIG. 4 is a block diagram of an exemplary multi-bit digital delta-sigma modulator used within the D/A converter of FIG. 3.

FIG. 4 illustrates one example by which multi-bit digital delta-sigma modulator 32 can be implemented. In particular, a second order modulator is shown, with corresponding pairs of integrators 42 and summing nodes 44. Since modulator 32 operates entirely in the digital realm, the- feedback loop carries digital signals which are subtracted from the incoming digital signal using, for example, two's complement adders. A multi-bit quantizer 46 can also be used in the feedback loop, similar in function to quantizer 22, shown in FIG. 2, except that sampling is performed entirely in the digital realm using registers, adders, and the like.

Figure 5:
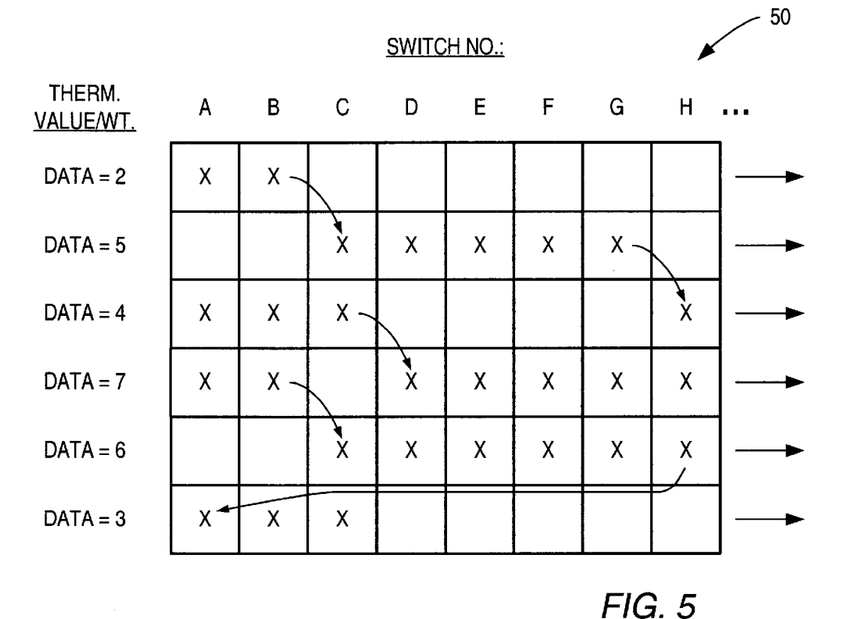
FIG. 5 is a table that illustrates a conventional method for element mismatch cancellation using a single direction rotation mechanism for selecting from among a plurality of components applied to the D/A converter.
Figure 6:
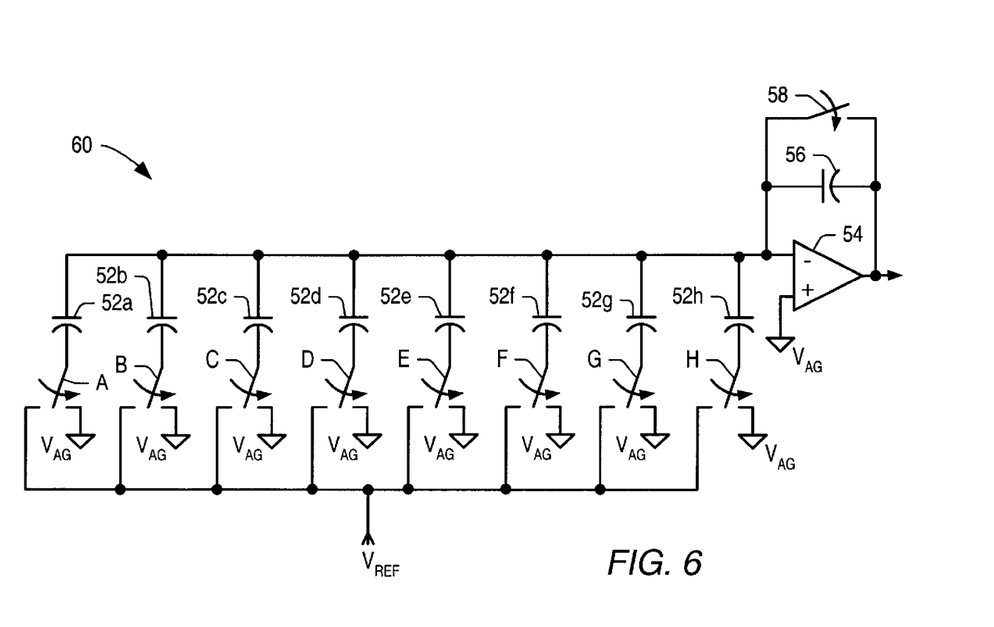
FIG. 6 is a circuit schematic of a D/A converter having a plurality of components switchably connected to an operational amplifier of the D/A converter according to various DEM mechanisms.

FIG. 5 is a table 50 which illustrates a conventional rotation mechanism. The understanding of FIG. 5 is more apparent when reviewing the same in connection with FIG. 6. More specifically, FIG. 6 illustrates a D/A converter having a plurality of elements or "components" 52a–h switchably connected to either a reference voltage. $V_{REF}$ or analog ground $V_{AG}$. The components (i.e., capacitors, resistors, and/or current sources) that are switchably connected together at the input of an operational amplifier 54 depend on the status of control signals sent from the DEM logic to switches A–H. A feedback capacitor 56 and a discharge switch 58 can be linked in parallel across the inverting input of op amp 54. Thus, the D/A converter 60 shown in FIG. 6 contains a series of components that are switchably linked to the input of an op amp 54. The number or magnitude of components linked will dictate the amplitude of the resulting analog output.

FIG. 5 indicates a conventional, single direction rotational mechanism by which components or elements are connected. According to the example shown, if the thermometer data value/weight is representative of two bits, then switches A and B are said to have been activated. In a subsequent set of bit values (i.e., a subsequent clock cycle) five bit values may be set. However, the first bit value is shown immediately to the right of the last active component. Thus, the first switched element C begins where the last switched element B ends. Thus, switching the various elements to $V_{REF}$, instead of $V_{AG}$ is shown to occur in a direction from left-to-right. Specifically, the next switched element within a succeeding clock cycle will be to the immediate right of the last switched element of the previous clock cycle. FIG. 5 illustrates this concept, as well as the concept of a wrap around whenever elements extending beyond element H are to be switched. In this instance, the next switched element will be element A and so forth as the successive switched components are simply wrapped back from element H. It is important to note that while only eight elements or components are shown, there can be numerous switched components within a D/A converter beyond eight. For the sake of brevity, however, only eight are shown.

Figure 7:
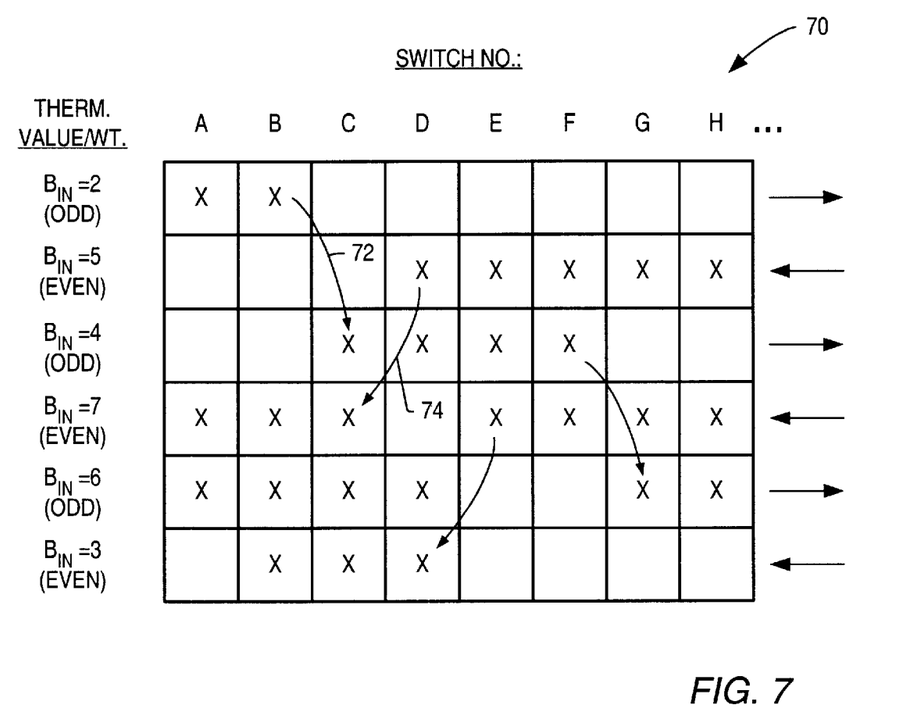
FIG. 7 is a table that illustrates an improved method for element mismatch cancellation using a bi-directional rotation mechanism for selecting from among a plurality of components shown in the example of FIG. 6.

FIG. 7 illustrates a bi-directional rotational scheme according to a preferred embodiment, whereby all odd thermometer values/weights are rotated from left-to-right, and all even values/weights are rotated from right-to-left. Odd and even only indicates the order within the sequence of clock cycles (or discrete thermometer bit values), whereby clock cycles 1, 3, 5, 7, etc., are odd and clock cycles 2, 4, 6, 8, etc., are even. The first clock cycle having a value/weight of two is an odd clock cycle, and the next clock cycle having a value/weight of five is even. By interspersing the odd and even rotational directions, more randomness is imparted to the actual selection process to avoid the tonal and periodic dependencies of a single direction rotation. Both directions have a separate and- individual index pointer to store the starting point of the next rotation of its direction. The jump between the separate index pointers is a nearly random sequence. This essentially eliminates tones while preserving the noise shaping property by rotation.

Using the example shown in FIG. 7, table 70 indicates that for the first thermometer value of two, elements A and B are switched and connected together to the op amp input of the D/A converter. The successive coupling begins with element A and ends with element B. The next cycle begins with component H and ends with component D. A pointer is used to retain the last element position of the previous odd and even cycles. The pointer thereby indicates that component B was the last element switched in the odd, left-to-right rotation, and component D was the last component switched in the even, right-to-left rotation. Therefore, when the next cycle is encountered, and it is an odd cycle, then the pointer will note that the first switched component will be immediately right of the last switched component of the corresponding left-to-right (odd) rotational components. This notation is shown as item 72. When the next cycle is encountered, the pointer for even cycles will note that the last component D switch will indicate that the first component switched in the succeeding (even) cycle will be component C. Given that the weight is seven, component C, followed by B, followed by A, followed by H (due to wraparound), followed by G, followed by F, and finally E will be switched in parallel between $V_{REF}$ and the non-inverting input of op amp 54 (FIG. 6). The pointer indication between the last switched component and the initial switched component of odd cycles is shown by reference numeral 74.

FIG. 7 illustrates interspersed right and left rotations for succeeding clock cycles and/or thermometer values. While switching taught herein is ordered, the effect is to randomize the switching of components beyond that available through a single-direction rotation scheme. Thus, bi-directional rotation affords many advantages beyond that available with one-direction or single-direction rotation.

Figure 8:
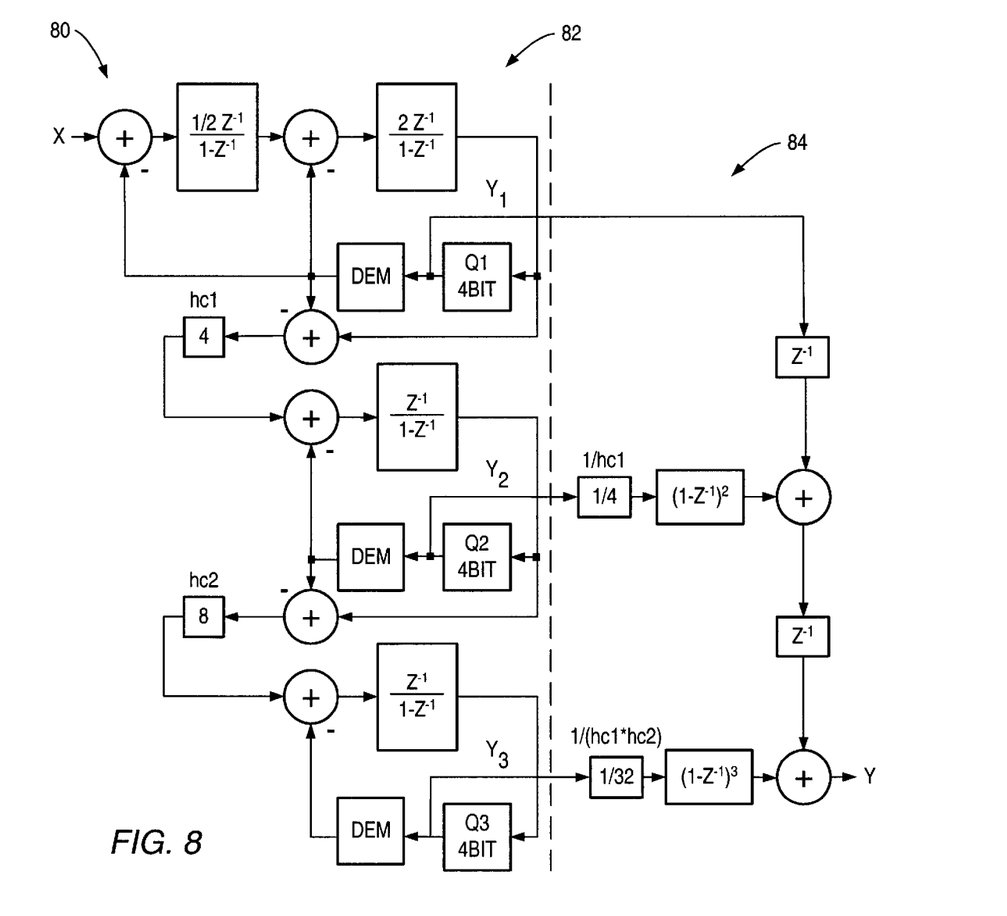
FIG. 8 is a block diagram of a cascaded modulator having noise cancellation logic, according to one embodiment.

Turning now to FIG. 8, an example by which bi-directional rotation can be implemented and a modulator 80 is shown. Modulator 80 is a cascaded modulator, often known as a 2:1:1 cascade 82, coupled with a noise cancellation logic 84. The cascaded configuration 82 is shown having two integrators cascaded with a single integrator, and further cascaded with another single integrator. The growth of wire-line communications has increased the demand for high speed data converters with wide dynamic range and high linearity. The target specification of such A/D converters can be 90 dB SNR and 100 dB SFDR with a 2.5 MHz output rate. The key design issue for these types of A/D converter developments is a low oversampling delta-sigma architecture feasibility eight times the oversampling rate (OSR). This is important for integration with the digital decimation filter. A low sampling clock of 20 MHz makes digital switching noise management easier, and a single chip solution possible. Also, this will relax the speed requirements of the analog design for a low OSR, in which cascaded delta-sigma modulators are often used, because of the high order noise shaping realized with stability problems. A beneficial choice would be a 2:1:1 cascade, such as that shown in FIG. 8.

Figure 9:
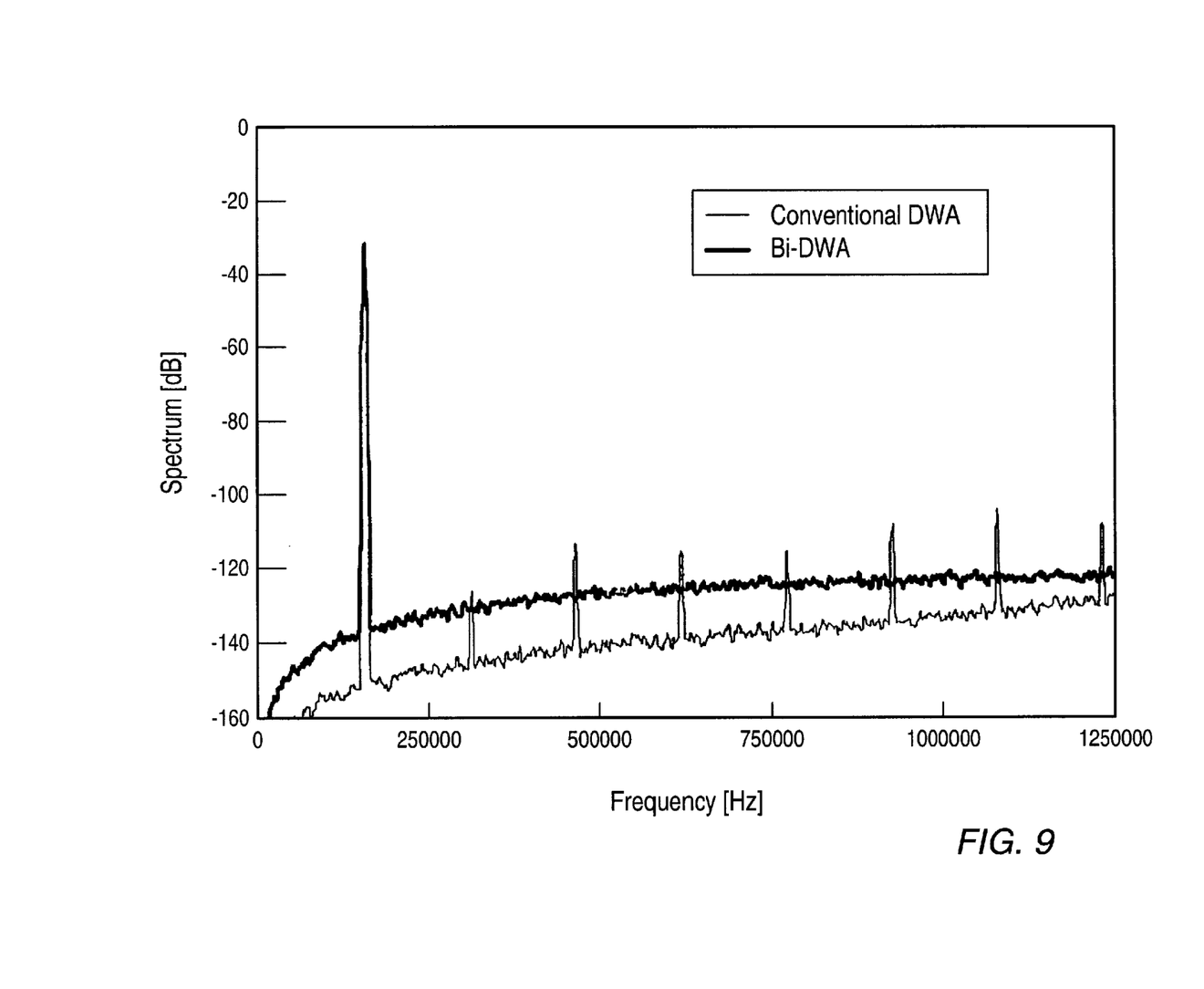
FIG. 9 is a graph showing simulated FFT spectrums for both conventional, single directional rotation and bi-directional rotation applied to the modulator of FIG. 5.

FIG. 9 shows simulated FFT spectrums for both conventional and bi-directional rotation applied to the delta-sigma modulator of FIG. 8. The D/A mismatch is 0.1% (one sigma), which is typical for an analog CMOS process with double polysilicon layers for capacitors. The simulation includes quantization noise and mismatch induced noise, but no analog device noise. In conventional rotation, because of its periodic nature, the mismatch error will be translated to signal dependent tones. This will degrade the SFDR and must be avoided. In bi-directional rotation, the jump between the separate index pointers is a nearly random sequence. This eliminates tones while preserving the noise shaping property by rotation. This is demonstrated in the simulation. The cost of bi-directional rotation is the rise of the noise floor.

Figure 10:
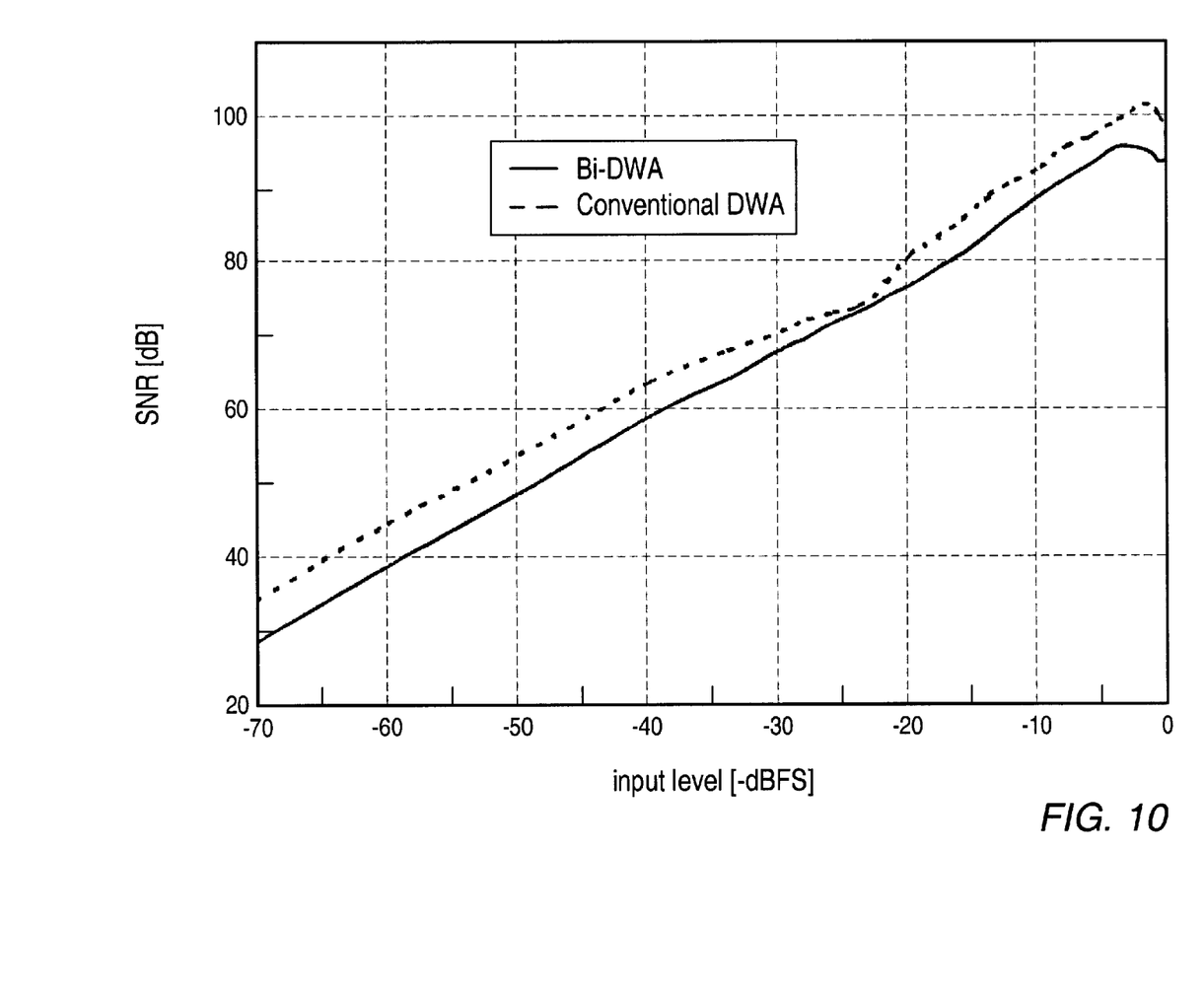
FIG. 10 is a graph showing simulated SNR versus input level with 0.1 percent mismatch.

FIG. 10 illustrates a simulated signal-to-noise ratio (SNR) versus input level with 0.1% mismatch. Conventional rotation shows variation in SNR to signal level. The out-of-band tones generated by rotation may fold back to in-band due to modulation by delta-sigma limit cycles. This makes the in-band noise power dependent on signal level. A dip at approximately −24 dBFS indicates the worst case for tone aliasing. On the other hand, for bi-directional rotation, the tones are low enough so that aliasing will not occur. This results in a straighter but lower line because of the higher noise floor. The loss of SNR compared to worst case of conventional rotation is only 1 dB. This means if the mismatch noise contributed is minor within the noise budget, it is beneficial to use bi-directional rotation and improve SFDR. The use of bi-directional rotation makes the first stage mismatch noise a minor contribution without sacrificing SFDR performance. Applying bi-directional rotation to all stages makes mismatch of the latter stages completely negligible.

Figure 11:
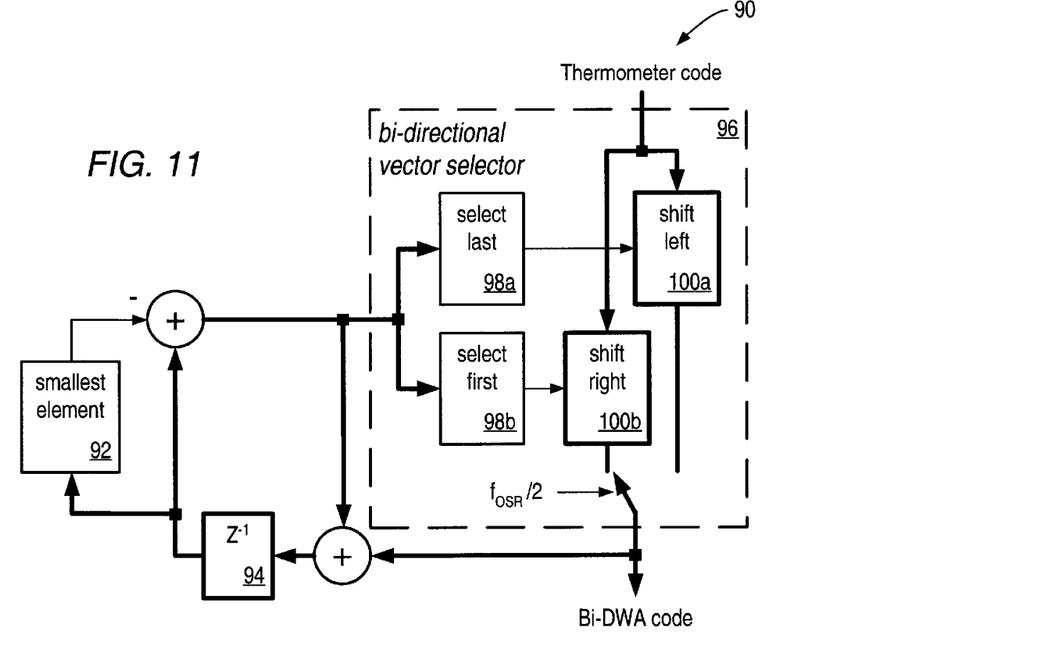
FIG. 11 is a block diagram of the bi-directional rotation mechanism implemented according to one example.

Decoder 90 can implement two separate and independent rotation mechanisms. According to one embodiment, the two rotation mechanisms are in separate and opposite directions, and can be implemented according to the example shown in FIG. 11. This structure realizes first order mismatch shaping by passing around vectors in a feedback loop within a delta sigma modulator, and using a vector selector. In particular, the smallest element is noted as selecting the smallest value within the vector, where the value from the feedback vector of a block having simply a delay function of $Z^{-1}$ is subtracted, shown as element 94. The system can be stable for a variety of transfer functions. First order mismatch-shaping would be $H(z)=1-Z^{-1}$; however, when simplified, the transfer function can simply be represented as $Z^{-1}$, while forwarding the delayed vector to be added with the summing node rather than subtracting from the summing node as in the implementation described by Schreier, "Mismatch-Shaping Digital-to-Analog Conversion," *Audio Engineering Society* (herein incorporated by reference). Contained within the phantom lines of FIG. 11 is logic 96, which performs bi-directional vector selection. Logic 96 includes circuitry that extracts the required pointers of the successive selection cycle based on information contained in the vector. That is, a pointer will note the starting position of an odd cycle, and another pointer will note the starting position of an even cycle. In this manner, the next element can be selected based on where that pointer is positioned. The circuits that extract the pointers can be represented as a first edge selector and the last edge selector of the vector, and indicated with reference numbers 98*a* and 98*b*. Thereafter, successive elements are to be connected and, depending on whether rotation proceeds from right-to-left or left-to-right, shifting will occur either in a left direction 100*a* or a right direction 100*b*. The first and last selection, and the right or left shifting will thereby determine the extent of elements which are to be connected by virtue of the control signals output as bi-directional data weighted averaging code, as shown. Such code is then forwarded to the corresponding switches within the D/A converter.

Figure 12:
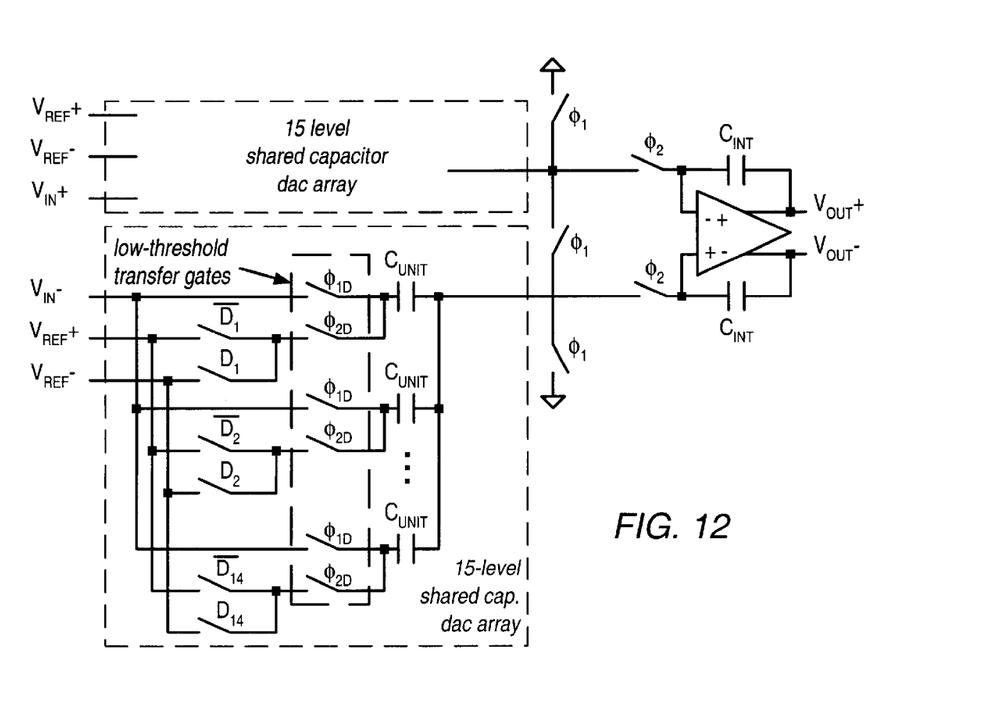
FIG. 12 is a switched capacitor integrator having a multi-bit D/A converter implemented according to one example.

FIG. 12 illustrates a switched capacitor integrator with a multi-bit D/A converter. The fully differential switched capacitor circuits are used for the delta-sigma modulator implementation. In the integrator stages, a common set of capacitors is shared by input sampling and the four bit D/A function. During the sampling phase phi1, a capacitor array of, for example, fifteen unit capacitors are tied in parallel and the bottom plates are connected to the input. During the integrate phase, phi2, the bottom plate of each unit is connected to the reference voltage corresponding to its digital input code. Eliminating one set of switched capacitors have advantages like, for example, 3 dB reduction of kT/C noise, smaller ac load, and smaller integrator pole error. Another advantage of the shared capacitor implementation at the front end is the relaxed A/D input drive requirement. Using this scheme, all capacitors are pre-charged to the previous quantizer output level, which closely tracks the input in multi-bit delta-sigma modulators.

It will be appreciated by those skilled in the art having the benefit of this disclosure that the embodiments herein are believed to be capable of applications with any data converter, including converters which have an oversampling modulator or a converter found as part of a D/A converter. Furthermore, it is also to be understood that the embodiments shown and described are to be taken as presently preferred embodiments. Using bi-directional rotation eliminates tones caused by conventional, single direction rotation, minimizes circuit increase compared to conventional rotation, and presents only a minor increase of noise generated by mismatch induced noise with negligible impact for cases when mismatch noise is minor within the noise budget. Various modifications and changes may be made to each and every circuit or block element as would be obvious to a person skilled in the art having the benefit of this disclosure. It is intended that the following claims be interpreted to embrace all such modifications and changes and, accordingly, the specification and drawings are to be regarded in an illustrative rather than restrictive sense.

What is claimed is:

1. A circuit for minimizing electrical component value mismatches within a data converter, comprising:
   a plurality of electrical components;
   a plurality of switches adapted to connect a first subset of the electrical components to avoltage in successive order progressing in a first direction and, subsequently, connect a second subset of the electrical components to the voltage in successiveorder progressing in a second direction opposite the first direction.

2. The circuit as recited in claim 1, wherein the plurality of switches are further adapted to connect additional subsets of the electrical components to the voltage in an alternating fashion between the first and second directions.

3. The circuit as recited in claim 1, wherein the first subset of electrical components connected in the first direction is the same as the second subset of electrical components connected in the second direction.

4. The circuit as recited in claim 1, wherein the plurality of electrical components is switchably connected to an input node of an amplifier.

5. The circuit as recited in claim 1, wherein the first subset of electrical components connected in the first direction is different from the second subset of electrical components connected in the second direction.

6. The circuit as recited in claim 4, wherein a number of the electrical components connected to the voltage determines the amplitude of an output signal of the amplifier.

7. A circuit within a data converter, wherein the circuit is adapted to alter the direction by which subsets of a plurality of electrical components are switchably connected to a voltage in a successive order.

8. The circuit as recited in claim 7, further comprising a plurality of switches, wherein the plurality of switches are adapted to connect a subset of the plurality of electrical components to the voltage in response to a control signal coupled to the plurality of switches.

9. The circuit as recited in claim 8, wherein the plurality of switches are further adapted to connect additional subsets of the electrical components to the voltage in an alternating fashion between the first and second directions.

10. The circuit as recited in claim 8, wherein the subset of electrical components is connected to an input node of an amplifier, and wherein the extent of the subset of electrical components determines the magnitude of an output signal of the amplifier.

11. The circuit as recited in claim 8, wherein the control signal is adapted to indicate the subset of electrical components to be connected, and the direction by which the subset of electrical components are connected in successive order.

12. The circuit as recited in claim 9, wherein the control signal is further adapted to connect the subset of electrical components in a first direction and, subsequently, connect another subset of electrical components in a second direction opposite the first direction.

13. The circuit as recited in claim 12, wherein the subset of components connected in the first direction is the same as or different from the subset of components connected in the second direction.

14. A circuit within a data converter, comprising:
   a plurality of electrical components;
   a plurality of switches adapted to connect the plurality of electrical components to a voltage;
   a first shift register adapted to select a first subset of the plurality of electrical components in successive order along a first direction; and
   a second shift register adapted to select a second subset of the plurality of electrical components in successive order along a second direction opposite to the first direction.

15. The circuit as recited in claim 14, further comprising a periodic switch adapted to alternate between the first direction and The second direction in response to a periodic signal.

16. The circuit as recited in claim 14, wherein the first direction corresponds to a first sequence of the plurality of electrical components, wherein the second direction corresponds to a second sequence of the plurality of electrical components.

17. The circuit as recited in claim 14, further comprising a pointer extraction circuit adapted to locate a starting position of the subset and a starting position of the second subset.

18. The circuit as recited in claim 17, wherein the pointer extraction circuit comprises:
   a first edge selector adapted to point to the starting positions of the first and second subsets, and
   a last edge selector adapted to point to the ending positions of the first and second subsets.

19. The circuit as recited in claim 17, wherein the pointer extraction circuit and the first and second shift registers are adapted to provide a control signal to the plurality of switches.

20. The circuit as recited in claim 19, wherein the control signal is adapted to indicate a subset of electrical components to be connected, and the direction by which the subset of electrical components are connected in successive order.

* * * * *

UNITED STATES PATENT AND TRADEMARK OFFICE
CERTIFICATE OF CORRECTION

PATENT NO. : 6,522,277 B2
DATED : February 18, 2003
INVENTOR(S) : Fujimori et al.

It is certified that error appears in the above-identified patent and that said Letters Patent is hereby corrected as shown below:

Column 12,
Line 8, after the phrase "position of the" please insert -- first --.

Signed and Sealed this

Twelfth Day of August, 2003

JAMES E. ROGAN
*Director of the United States Patent and Trademark Office*